United States Patent
Larson et al.

(10) Patent No.: US 9,484,243 B2
(45) Date of Patent: Nov. 1, 2016

(54) PROCESSING CHAMBER WITH FEATURES FROM SIDE WALL

(71) Applicant: Lam Research Corporation, Fremont, CA (US)

(72) Inventors: Dean J. Larson, Pleasanton, CA (US); Jason Augustino, Livermore, CA (US); Andreas Fischer, Castro Valley, CA (US); Andre W. Desepte, San Jose, CA (US); Harmeet Singh, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 266 days.

(21) Appl. No.: 14/255,730

(22) Filed: Apr. 17, 2014

(65) Prior Publication Data

US 2015/0303085 A1    Oct. 22, 2015

(51) Int. Cl.
  *H01L 21/673* (2006.01)
  *H01L 21/687* (2006.01)
  *H01L 21/67* (2006.01)

(52) U.S. Cl.
  CPC ..... *H01L 21/68785* (2013.01); *H01L 21/6719* (2013.01)

(58) Field of Classification Search
  CPC ................ H01L 21/68785; H01L 21/6719
  See application file for complete search history.

(56) References Cited

U.S. PATENT DOCUMENTS

| | | | |
|---|---|---|---|
| 5,725,718 A | 3/1998 | Banholzer et al. | |
| 6,221,781 B1 | 4/2001 | Siefering et al. | |
| 7,639,029 B2 | 12/2009 | Wetzel et al. | |
| 7,750,657 B2 | 7/2010 | Schmidt et al. | |
| 8,124,907 B2 * | 2/2012 | Lee ............. | H01L 21/67201 156/345.54 |
| 2008/0232933 A1 | 9/2008 | Kiley et al. | |
| 2013/0337661 A1 * | 12/2013 | Kato ............. | H01L 21/26 438/795 |

* cited by examiner

*Primary Examiner* — Patrick Maestri
(74) *Attorney, Agent, or Firm* — Beyer Law Group LLP (57) ABSTRACT

A processing chamber having a chamber housing with a top and sidewalls is provided. The processing chamber has a seal for connecting the sidewalls of the chamber housing to a top of a lower chamber below the processing chamber. A substrate holder is attached to the sidewalls of the chamber housing. Further, a wafer lift ring supported by a side arm extending through the sidewalls has at least three posts each having at least one finger, the top of the fingers defining a first wafer handoff plane. The lower chamber has at least one lowest wafer support that defines a second wafer handoff plane where the height between the first wafer handoff plane and the second wafer handoff plane is not greater than a maximum vertical stroke of a transfer arm that is configured to transfer a wafer from the first wafer handoff plane and the second wafer handoff plane.

16 Claims, 12 Drawing Sheets

PROCESSING CHAMBER WITH FEATURES FROM SIDE WALL

BACKGROUND OF THE INVENTION

Field of the Invention

The invention relates to a processing chamber. More specifically, the invention relates to engineering a processing chamber that meets desired characteristics related to the overall systematic efficiency.

In the design of processing chambers, height constraint can influence the amount of characteristics that are able to be integrated into the chamber. Features would typically be fed from below the substrate to maintain cylindrical symmetry inside the chamber.

SUMMARY OF THE INVENTION

To achieve the foregoing and in accordance with the purpose of the present invention, a processing chamber apparatus is provided. The processing chamber has a chamber housing having a top and sidewalls. The processing chamber also has a seal for connecting the sidewalls of the chamber housing to a top of a lower chamber positioned below the processing chamber. Additionally, the processing chamber has a substrate holder attached to the sidewalls of the chamber housing. Further, the processing chamber has a wafer lift ring supported by a side arm extending through the sidewalls of the chamber housing. The wafer lift ring has at least three posts that stand vertically, each post having at least one finger that extends horizontally from the post. The top of the fingers of the wafer lift ring in an up position define a first wafer handoff plane. Additionally, a lower chamber positioned below the processing chamber is provided. The lower chamber has at least one wafer support, wherein the top of the lowest at least one wafer support defines a second wafer handoff plane. Further, the height between the first wafer handoff plane and the second wafer handoff plane is not greater than a maximum vertical stroke of a transfer arm that is configured to transfer a wafer from the first wafer handoff plane and the second wafer handoff plane.

In another embodiment of the present invention, a processing chamber apparatus is provided. The processing chamber has a chamber housing having a top and sidewalls. The processing chamber also has a seal for connecting the sidewalls of the chamber housing to a top of a chamber positioned below the processing chamber. Additionally, the processing chamber has a substrate holder attached to the sidewalls of the chamber housing.

In further embodiment of the present invention, a processing chamber is provided. The processing chamber has a chamber housing having a top and sidewalls. The processing chamber also has a seal for connecting the sidewalls of the chamber housing to a top of a chamber positioned below the processing chamber. Additionally, the processing chamber has a substrate holder attached to the sidewalls of the chamber housing. The substrate holder is attached to the sidewalls via flexure side mountings having convolutions. The processing chamber also has a wafer lift ring supported by a side arm extending through the sidewalls of the chamber housing.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In the design of processing chambers, the choices of characteristics that are able to be integrated into a processing chamber are generally influenced by height constraints. As such, if a processing chamber does not have significant height, there may not be enough vertical space to install facilities to the wafer support. As a way of minimizing height constraints, this disclosure discusses providing facilities and mounting supports on sidewalls of the processing chamber rather than from the floor. In one example, to save more vertical space, the chamber floor was eliminated. In this example, the ceiling of an adjoining chamber served as a floor of the processing chamber.

Since the chamber floor is eliminated in the described embodiment, all mounting features for the substrate holder and all facilities in the discussed embodiment have been designed such that they are installed from the chamber sidewalls. This involves side-mounted substrate holder flexures for supporting the substrate holder in a well-defined position, the power feed for the heaters of the substrate holder, and the temperature sensors as well as the wafer lift mechanism. In this way, the invention utilizes a chamber design without any mounting or support features from the floor of the chamber. In fact, the chamber floor has been eliminated entirely. Accordingly, all mounting features for the substrate holder and for the wafer lift as well as all facilities and sensors are supported/supplied sideways and are attached at the chamber sidewall.

Figure 1:
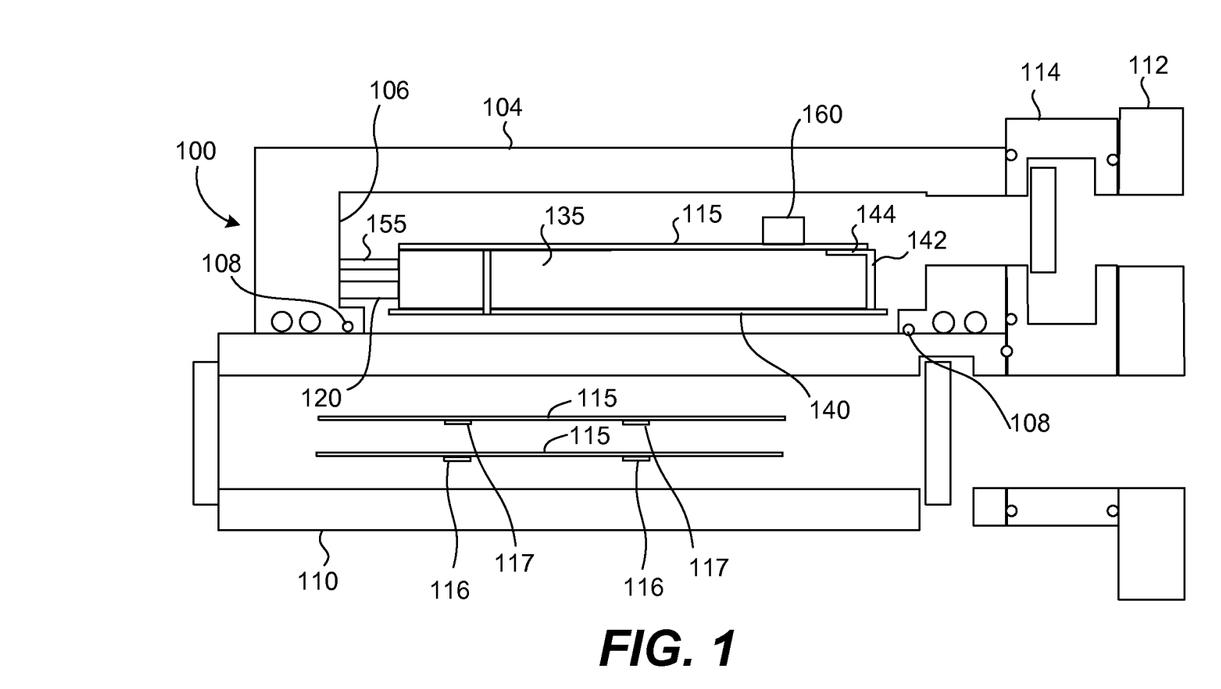
FIG. 1 is a generalized view of a processing chamber in accordance with embodiments of the present invention.

FIG. 1 is a generalized view of a processing chamber 100 in accordance with embodiments of the present invention. As seen in FIG. 1, a chamber housing 104 is placed on top of lower chamber 110 to form a processing chamber 100. Chamber housing 104 and lower chamber 110 contain wafers 115 as seen in FIG. 1. For example, in processing chamber 100, a wafer 115 sits atop substrate holder 135. In lower chamber 110, wafers 115 sit atop wafer supports 116, 117. Wafer supports, such as lowest wafer supports 116 and upper wafer supports 117, may include wafer slots as seen in the lower chamber 110 of FIG. 1, or may include slots or other forms of wafer supports. Wafers 115 may be lifted using wafer lift ring 140 having three posts 142, each post having a finger 144. The fingers 144 may be cantilevered. Additionally, chamber housing 104 has seals 108 such that the top of lower chamber 110 is the floor of processing chamber 100. In this way, processing chamber 100 is floorless in that its floor comes from the ceiling of a lower chamber 110. Further, FIG. 1 illustrates power side feed 155 and pump port 160.

In examples, processing chamber 100 may be used for a number of applications, including but not limited to stripping, annealing, an outgassing process, a heating process, or a plasma process. Additionally, the lower chamber 110 may be a transferring chamber. Alternatively, however, the lower chamber 110 may be another form of a processing chamber. FIG. 1 also shows processing chamber 100 in relation to a vacuum transport module (VTM 112), and a VTM interface 114. Wafers 115 may be delivered into the vacuum transport module VTM 112 through a transfer chamber. The VTM 112 places wafers 115 in one of six chambers. VTM interface 114 allows the VTM 112 to interact with the chambers, such as chambers 100, 110.

Figure 2:
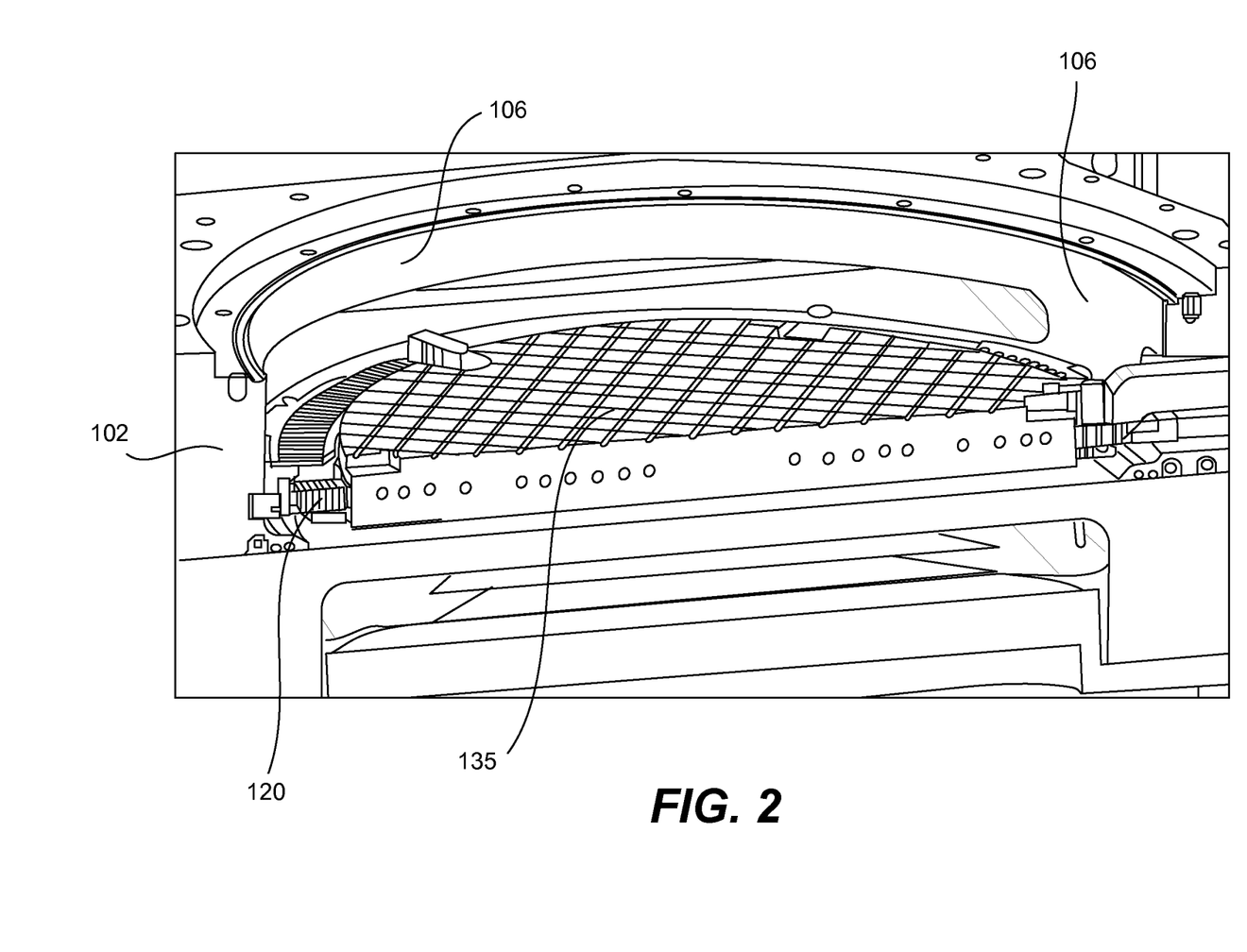
FIG. 2 illustrates a base portion of a processing chamber in accordance with embodiments of the present invention.

In a more specific example, FIG. 2 illustrates a base portion 102 of a processing chamber 100 in accordance with embodiments of the present invention. As seen in FIG. 2, features of a processing chamber 100 are provided through sidewalls 106. For example, a substrate holder 135 is positioned using flexures 120 that are attached to the sidewalls 106 of processing chamber 100. Further details of the features associated a processing chamber 100 are discussed below.

Figure 3:
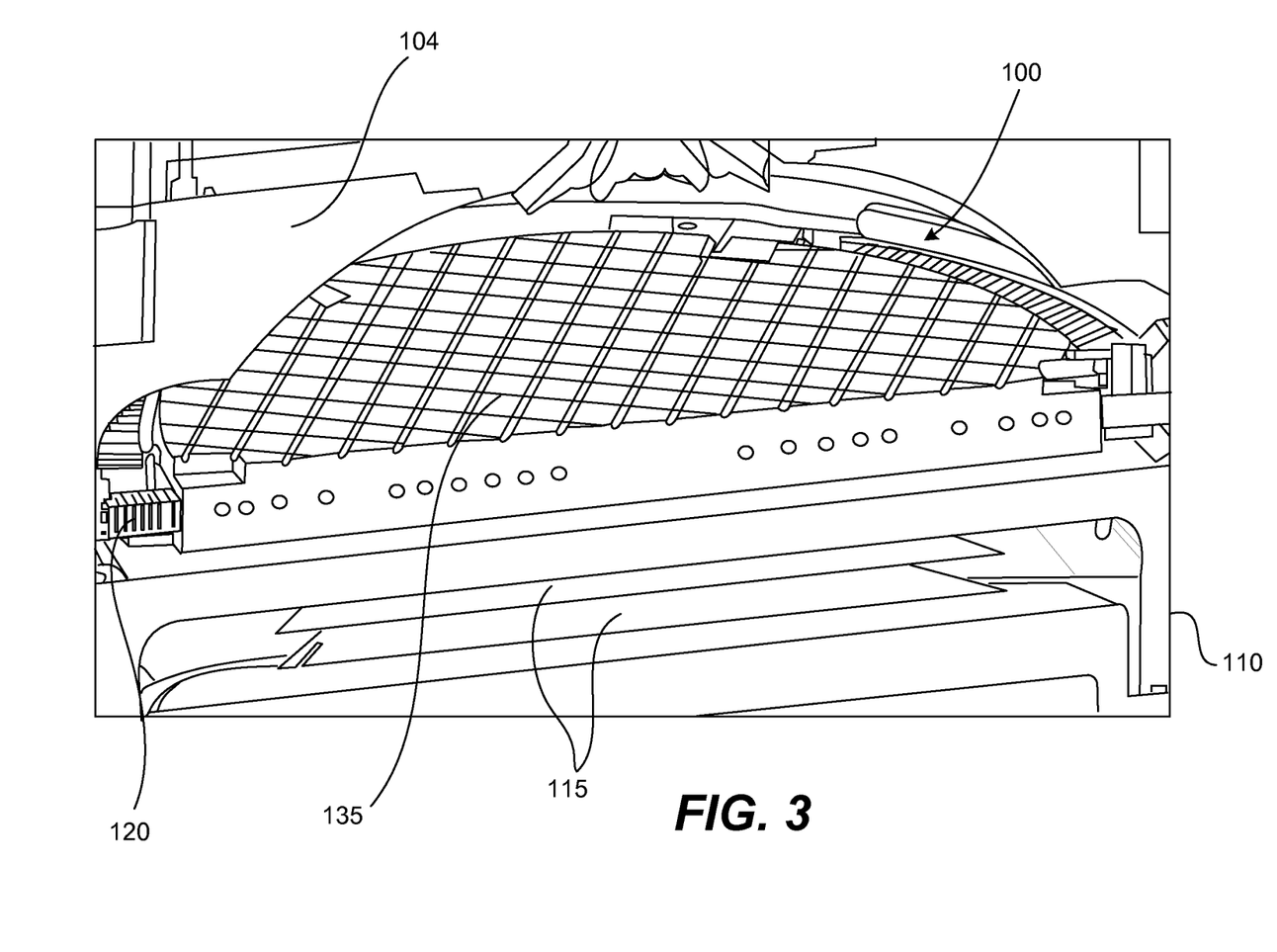
FIG. 3 illustrates a schematic view of a processing chamber having the base portion of FIG. 2 as well as having a chamber housing in accordance with embodiments of the present invention.

FIG. 3 illustrates a schematic view of a processing chamber 100 having the base portion 102 of FIG. 2 as well as having a chamber housing 104 in accordance with embodiments of the present invention. Chamber housing 104 forms the top of processing chamber 100. As seen in FIG. 3, a processing chamber 100 having features based in the sidewalls 106 of the processing chamber 100 is provided. In particular, processing chamber 100 has sidewalls 106, where processing chamber 100 is floorless. Instead of a floor, the sidewalls 106 of processing chamber 100 sit atop lower chamber 110 such that the top of lower chamber 110 serves as the floor of processing chamber 100. As processing chamber 100 is floorless, characteristics of the processing chamber 100 are provided through the sidewalls 106 of processing chamber 100. Further details of the features associated a processing chamber 100 are discussed below.

Figure 4:
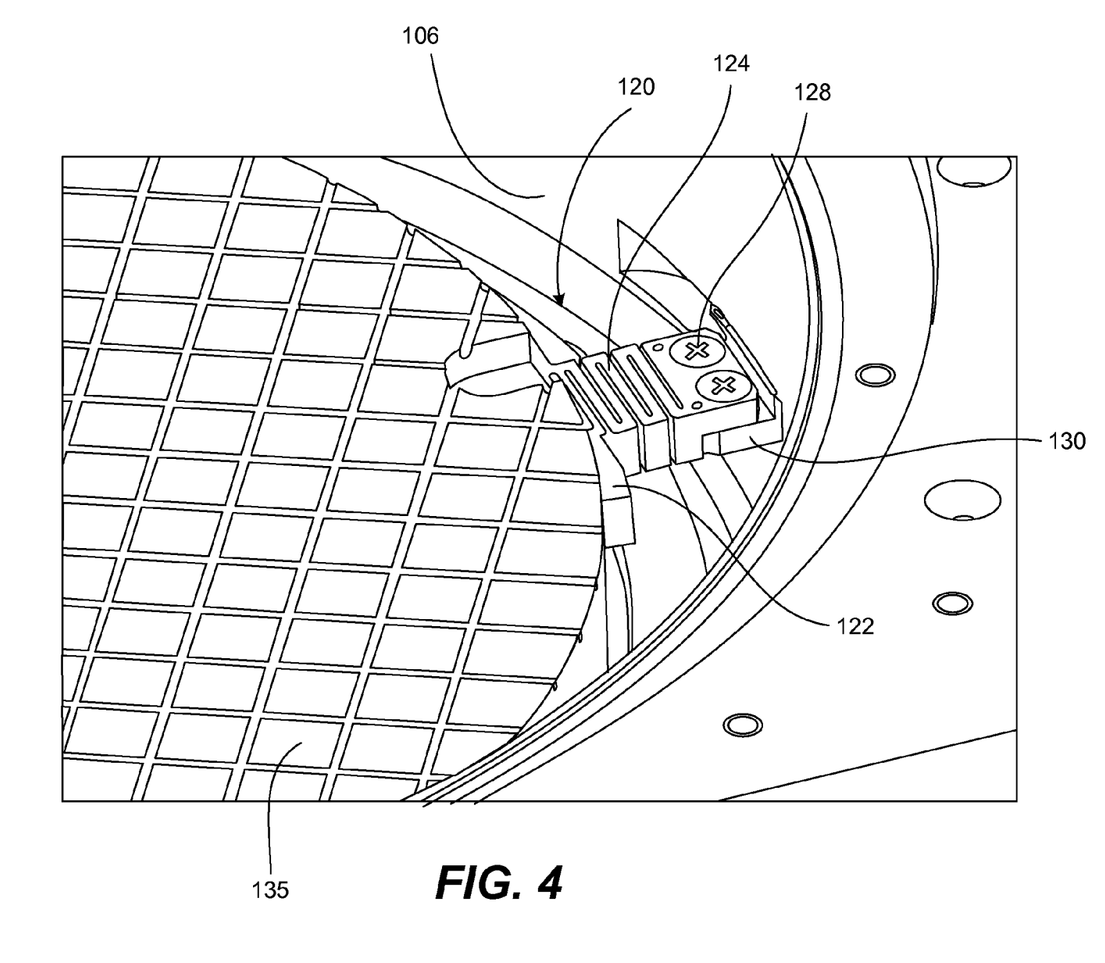
FIG. 4 illustrates a perspective view of a side-mounted substrate holder flexure in accordance with embodiments of the present invention.

FIG. 4 illustrates a perspective view of a side-mounted substrate holder flexure 120 in accordance with embodiments of the present invention. As with other aspects of the present invention, the side-mounted substrate holder flexure 120 is designed to minimize height constraints. As such, the mounting features 130 for the side-mounted substrate holder flexure 120 are located sideways and are attached to the chamber sidewall 106. This is seen in FIG. 4 as side-mounted substrate holder flexure 120 is attached to substrate holder 135 and is also attached to a mounting feature 130 that extends from sidewall 106. Side-mounted substrate holder flexure 120 is attached to mounting feature 130 using two screws 126. In alternative embodiments, side-mounted substrate holder flexure 120 may be attached to mounting feature 130 using only one screw or multiples screws or another form of attachment mechanism. In this way, the side-mounted substrate holder flexures 120 are not mounted to the floor. Again, the floor in the processing chamber 100 is formed from the ceiling of the lower chamber 110 which is below the processing chamber 100.

The side-mounted substrate holder flexures 120 may be designed to work in tandem with power side feeds 155 entering the processing chamber 100. In particular, the stiffness of the power side feeds 155 may need to be significantly more compliant than the side-mounted substrate holder flexures 120 so as to maintain satisfactory centering of the wafer 115 under various thermal conditions. With that said, ideally the side-mounted substrate holder flexures 120 should be as compliant as possible so as to minimize radial loading between the substrate holder 135 and the chamber housing 104, as well as having sufficient stiffness so as to maintain the centering of the substrate holder 135 as the substrate holder 135 undergoes differing thermal conditions. Further, the side-mounted substrate holder flexures 120 may also be thin enough to clear the upper substrate holder 135 top surface and still being above the wafer lift ring 140, discussed below, when the substrate holder 135 is mounted at the vertical structural mid-plane. In a preferred application, the side-mounted substrate holder flexures 120 have tension on the substrate holder 135 at room temperature such that the flexures 120 have minimal or no compression stress at a desired substrate holder 135 temperature set point. In alternative embodiments, though, the substrate holder flexures 120 may be designed to have no stress at room temperature or to even have compression at room temperature depending on the processing chamber 100 operating condition.

Figure 5:
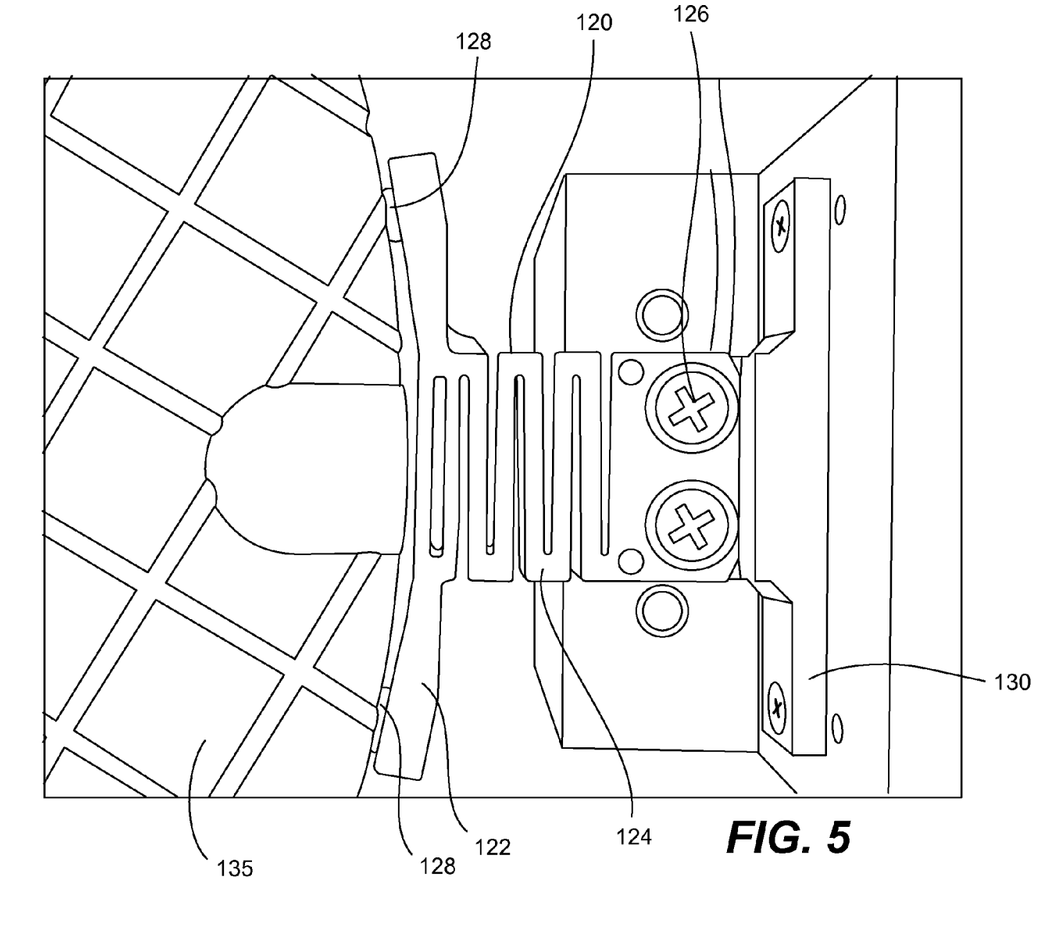
FIG. 5 illustrates an overhead view of a side-mounted substrate holder flexure in accordance with embodiments of the present invention.

The side-mounted substrate holder flexures 120 are designed to minimize heat losses of the substrate holder 135 during high temperature operations. This is to assure best on-wafer uniformity performance, and minimize heated substrate holder 135 re-sizing, minimizing heater cost and complexity. The preferred application is to heavily sink the flexure 120 mounting to the cooler chamber housing 104, to keep the high stress areas of the flexure 120 at as low of a temperature as possible, then to heavily heat choke the flexure 120 connection to the substrate holder 135 and also heat choke the path from the substrate holder mount 128 to the flexure 120. This design feature is visible in FIG. 5 which illustrates an overhead view of a side-mounted substrate holder flexure 120 of FIG. 4 in accordance with embodiments of the present invention. As seen in FIG. 5, side-mounted substrate holder flexure 120 has an elongated base portion 122 of flexure 120 that is attached to substrate holder 135 at two connection points 128. There is also an air gap between most of the elongated base portion 122 of flexure 120 and substrate holder 135, which serves as a heat choke. Additionally, side-mounted substrate holder flexure 120 also has a serpentine portion 124 that serves as another heat choke by requiring heat to pass through a long path before reaching the sidewall 106 of the processing chamber 100.

In this way, the side-mounted substrate holder flexure 120 is designed such that the substrate holder 135 can grow radially relative to the chamber housing 104 as the substrate holder 135 heats up. Since the substrate holder 135 expands as the chamber housing 104 stays in the same position, the side-mounted substrate holder flexure 120 has to have a spring to pick up that travel without inducing a lot of radial load either on the chamber housing 104 or on the substrate holder 135. In order to do this, there is a serpentine portion 124 within side-mounted substrate holder flexure 120 to create a compliant spring nature to it. Another design feature was the choice to use an aluminum component for the side-mounted substrate holder flexure 120. Aluminum is not typically chosen for elevated temperature dynamic spring applications, due to its limited upper working temperature range and limited fatigue life. However, when properly sized to manage induced elevated temperature dynamic stresses and elevated temperature related creep or sag, bare aluminum is the material of choice for this embodiment of a process environment application, due to gas chemical compatibilities. Based on the use of convolutions 124 as well as the heat chokes, there is minimal heat or power loss drawing out of the substrate holder 135, so that cold spots on the substrate holder 135 surface are avoided. Ideally, the substrate holder 135 surface is kept within a two degree Celsius range.

Figure 6:
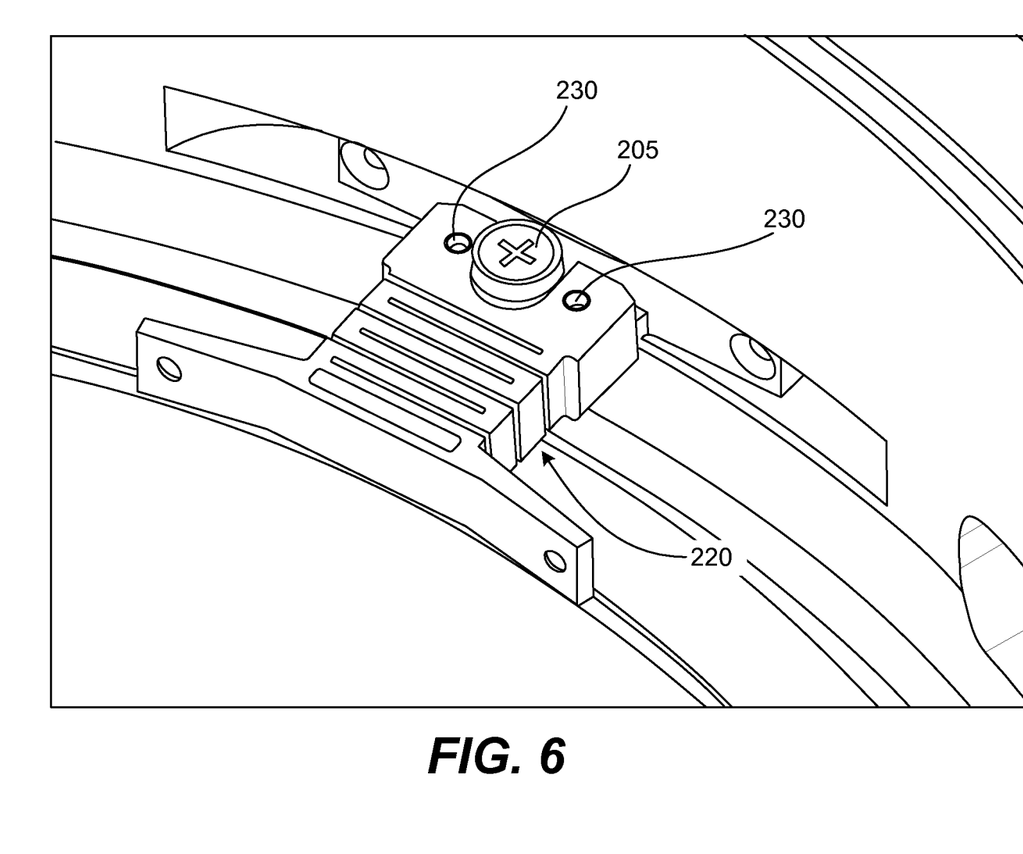
FIG. 6 illustrates a perspective view of gimbaling components in accordance with embodiments of the present invention.
Figure 7:
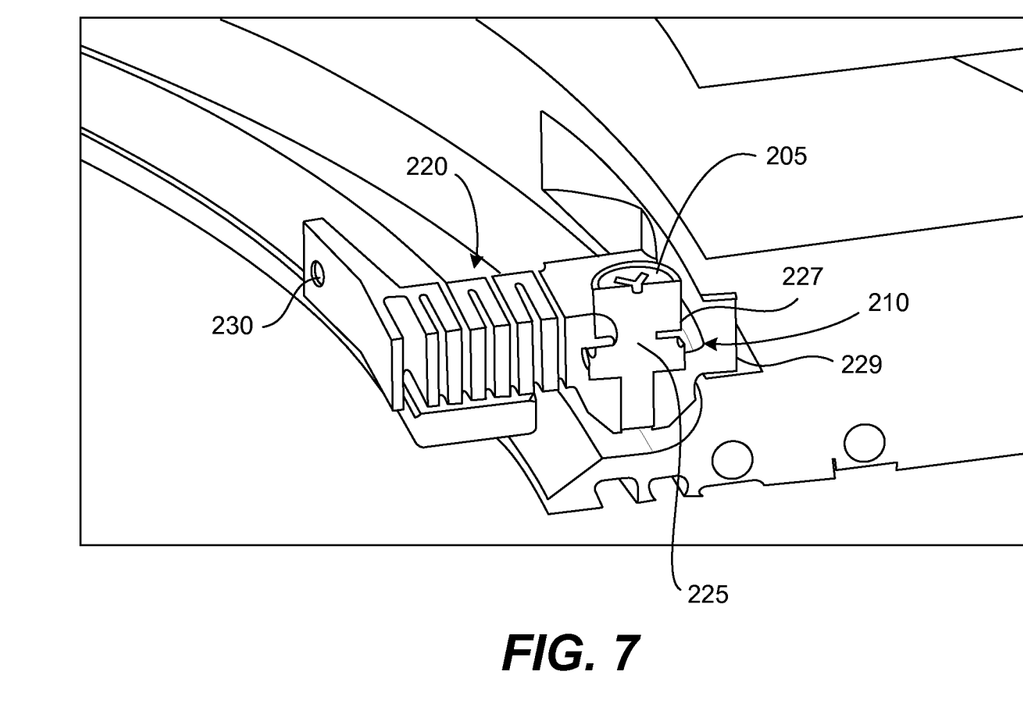
FIG. 7 illustrates a cut-away view of gimbaling components in accordance with embodiments of the present invention.

In some embodiments, a leveling system 210 may be added to the substrate holder flexures 220. This leveling system 210 may not be required in all embodiments as some embodiments may have sufficient precision of a tolerance within the substrate holder mounting system. However, for embodiments that would benefit from a leveling system 210, FIGS. 6 and 7 illustrate a perspective view and a cut-away view, respectively, of a side-mounted substrate holder flexure 220 having gimbaling components. The gimbaling features may be used as part of a substrate holder leveling system. The gimbaling system shown in FIGS. 6 and 7 has been designed to optimize height efficiency by having a very low aspect ratio profile. In this way, gimbaling features may be used to manually level a substrate holder 135 relative to the chamber housing 104 with a three-point gimbal system so that you have the proper degrees of freedom to level and to lock a desired position.

The gimbal system as described in FIGS. 6 and 7 has three points, one point at each of the three flexure locations. One point at one flexure, as shown in FIG. 7, acts only as a rotational gimbal, with no freedom to move in the X, Y, or Z directions. This gimbal controls the X, Y, Z position of substrate holder 135. The actual gimbal occurs between FIG. 7 locations of mounting screw 205 and central point 225. The points at the other two flexure locations, as shown in FIG. 6, utilize jack screws 230 to lift or drop those two locations, relative to the single rotational gimbal flexure point previously described. For these two flexure locations, which are jack locations, there is still a gimbal mounting screw 205 designed for solid lock down of that location after the leveling operation is complete. So when the leveling operation is complete, the mounting screws 205 at all three flexure locations require a specified torque to lock down all degrees of freedom of the leveling system. Accordingly, a central point is located within a mounting screw 205. A mounting screw 205 is illustrated in FIG. 6, which provides a perspective view of side-mounted substrate holder flexure 220 in accordance with embodiments of the present invention. The central point, which has a spherical component, does not move up or down or sideways, but rather just gimbals. A central point 225 is seen in FIG. 7, which provides a cut-away view of a side-mounted substrate holder flexure 220 in accordance with embodiments of the present invention. Central point 225 is located between a first shelf 227 and a second shelf 229 of a gimbaling system within side-mounted substrate holder flexure 220.

While the substrate holder 135 is gimbaling about the central point 225, the mounting screw 205 isn't synched down very tightly. In one example, the mounting screw 205 may be hand-tightened so that the substrate holder 135 is allowed to gimbal about the central point 225. In FIG. 6, the leveling system includes two jacking features that may be used to adjust the pitch and the yaw of the substrate holder. Each jacking feature is a pair of jacking screws 230 that enters into opening of side-mounted substrate holder flexures 220. By tightening one pair of jacking screws 230 on one flexure, relative to the other flexure, the pitch and yaw of the attached substrate holder 135 may be adjusted. Once the desired leveling is achieved, the mounting screw 205 may be used to lock down flexure 220 to mounting feature 130. Once the mounting screws 205 are tightened, all degrees of freedom are locked.

Another side-mounted characteristic of a floorless processing chamber 100 is a wafer lift. In particular, a wafer lift mechanism is provided that is mounted from the sidewalls 106 of the processing chamber 100. This involves mounting the lift drive 150 in a small housing, mounted to the side of the ICS chamber housing 104, and extending a cantilevered lift support arm 152 from the drive 150 to the wafer lift contact features. A vacuum feed through is located between drive 150 and the cantilevered lift support arm 152. Functional aspects related to adjusting the upper and lower stroke limits, the up and down stroke speed/motion, and wafer contact leveling, have all been functionally retained. Additionally, the wafer lift components are compatible with the required wafer processes, due to their compositions and/or exposure locations. In this way, the wafer lift mechanism is designed to work without any mounting or support features from the floor of processing chamber 100. Since the processing chamber 100 of the present disclosure is floorless, all mounting features for the wafer lift mechanism are supported and/or supplied sideways so as to be attached at the chamber sidewall. Accordingly, FIGS. 8-10 illustrate views of wafer lift components in accordance with embodiments of the present invention.

Figure 8:
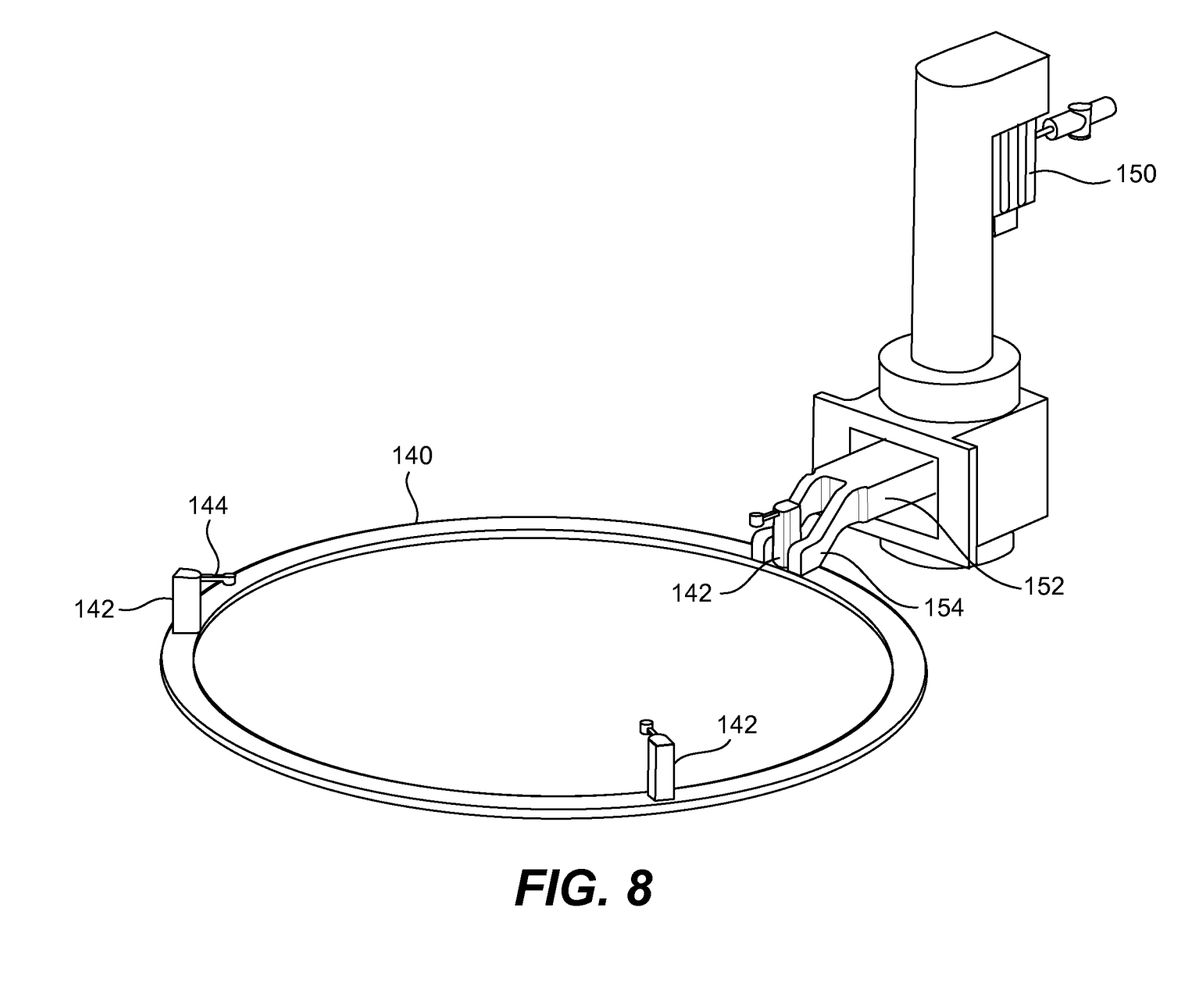
FIG. 8 illustrates wafer lift components in accordance with embodiments of the present invention.

FIG. 8 illustrates wafer lift components in accordance with embodiments of the present invention. As seen in FIG. 8, wafer lift ring 140 has three posts 142 that support a wafer 115. The three posts 142 are arranged 120 degrees apart from one another, though in alternative embodiments they may be spaced at different separations. Additionally, the posts 142 are arranged in a symmetric nature so as to be aligned with a wafer 115 as well as with a substrate holder. In addition to wafer lift ring 140, a drive 150 is provided to the side of wafer lift ring 140 and is cantilevered. In embodiments, drive 150 is mounted on the side of the processing chamber 100 and drive 150 has an arm 152 that is adjustable to extend to wafer lift ring 140. Arm 152 has graspers 154 which are able to engage with and raise wafer lift ring 140 vertically.

Figure 9:
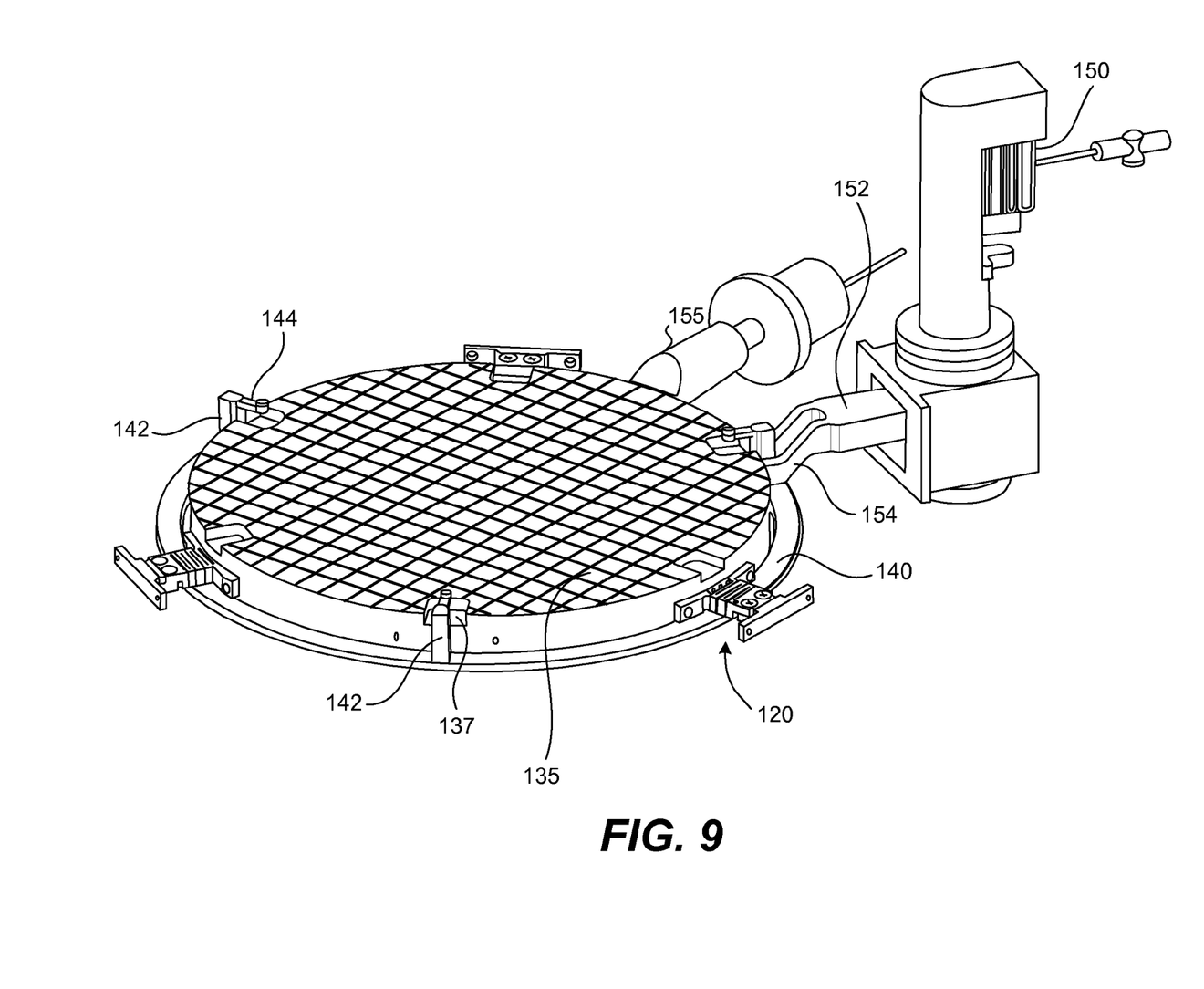
FIG. 9 illustrates wafer ring components as integrated with other side-mounted components in accordance with embodiments of the present invention.
Figure 10:
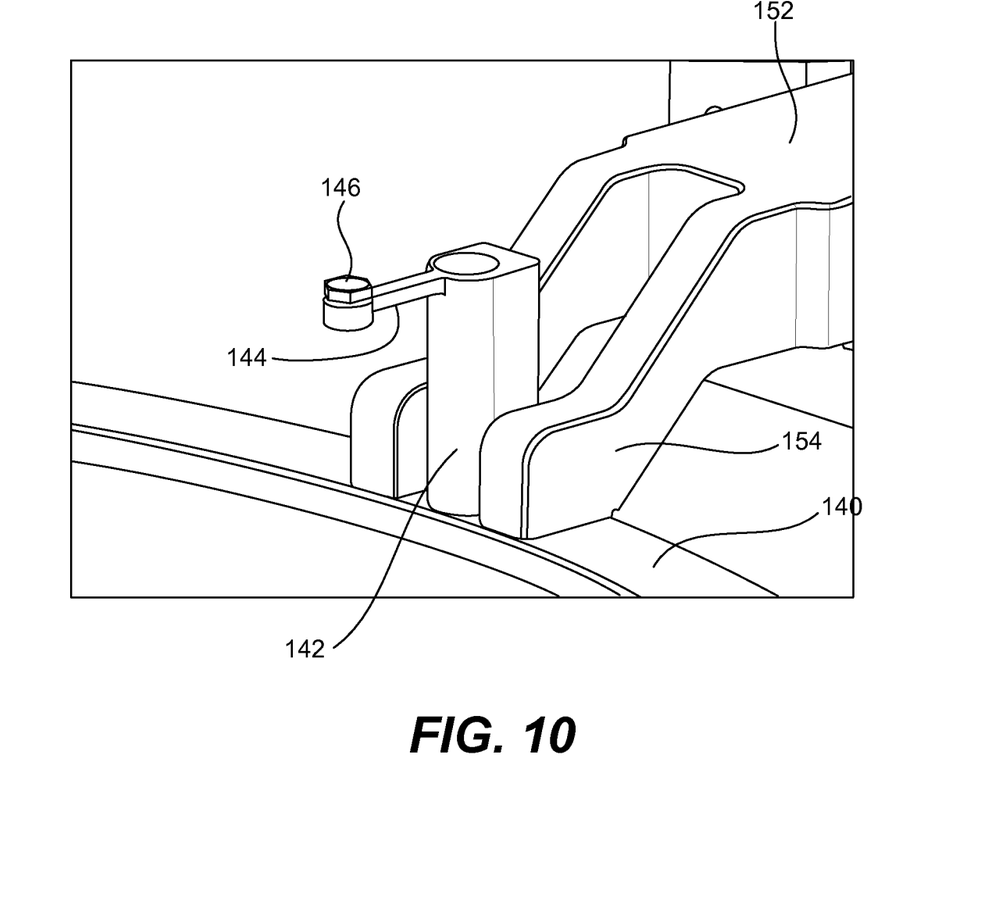
FIG. 10 illustrates a close-up view of post along wafer ring as post is about to be engaged by graspers of arm in accordance with embodiments of the present invention.

In prior art applications, a wafer lift ring is lifted from the bottom, but a processing chamber 100 discussed in the present disclosure is floorless so the wafer lift system as seen in FIGS. 8-10 employs a side arm 152 to raise a wafer lift ring 140 that supports a wafer 115. In particular, arm 152 has graspers 154 that are reaching to contact a wafer lift ring 140 and then raise the wafer lift ring 140 using the arm 152. The use of a vertical drive 150 raises technical challenges associated with providing a smooth, vertical motion. For example, when arm 152 is used to raise wafer lift ring 140 vertically, there's a higher bending moment on the drive 150 actuator as well as different parameters on features such as the placement air vents so that air is released in appropriate places. In another aspect of the wafer lift system, the side feed wafer lift cantilevered design needs to be structurally rigid enough to satisfactorily support and transfer wafers 115, but light enough to not exceed the weight and moment limits of smooth wafer lift drive motion and life. Process compatible materials other than aluminum have been utilized to accomplish this goal.

FIG. 9 illustrates wafer ring components as integrated with other side-mounted components of the present invention. As used in conjunction with other aspects of the present disclosure, wafer lift ring 140 sits below a substrate holder 135. When wafer lift ring 140 is raised, posts 142 align within pockets 137 of the top surface of the substrate holder 135 so that the cantilevered fingers 144 of posts 142 sit in the pockets 137 in the substrate holder 135. As seen in FIG. 9, fingers 144 of posts 142 should be sufficiently long so as to ensure that a wafer 115 is supported by each of the three posts 142 even if there is misalignment of the wafer 115. This misalignment tolerance is dependent upon the length of fingers 144, which is limited by the radial depth of pockets 137. Additionally, FIG. 10 illustrates a close-up view of post 142 along wafer lift ring 140, relative to graspers 154 of arm 152. As seen in FIG. 10, post 142 has a finger 144 that faces inward from post 142. Finger 144 has a pad 146 upon which a portion of a wafer 115 sits.

The wafer lift vertical alignment, relative to the substrate 135, is manually adjusted at upper and lower bump stops located at the drive 150. Then the three wafer lift contacts 146 are individually adjusted up or down, to a level attitude. This assures wafers can be transferred to/from the substrate 135, and/or transfer arm 118 (such as a robot end effector), without lateral shifting of the wafer 115 during wafer 115 transfers.

Another characteristic of a floorless processing chamber 100 is a power side feed 155. FIG. 1 illustrates a floorless processing chamber 100 having a power side feed 155. Power side feed 155 is a flexible side-fed vacuum connection for power feed of the heaters of the substrate holder 135. In connection with prior aspects, the side-mounted substrate holder flexure 120 as discussed in FIGS. 4 and 5 needs to be designed to work in tandem with the flexible, power side feed 155. In particular, the flexible, power side feed 155 stiffness needs to be significantly more compliant than a substrate flexure 120 side mounting so as to maintain satisfactory centering of the substrate holder 135 under all thermal conditions. Additionally, the flexible side feed 155 needs to utilize materials and design features which can adequately choke substrate holder 135 heat loss and maintain acceptable azimuthal wafer strip uniformity performance. As seen in FIG. 1, power side feed 155 enters into processing chamber 100.

Figure 11:
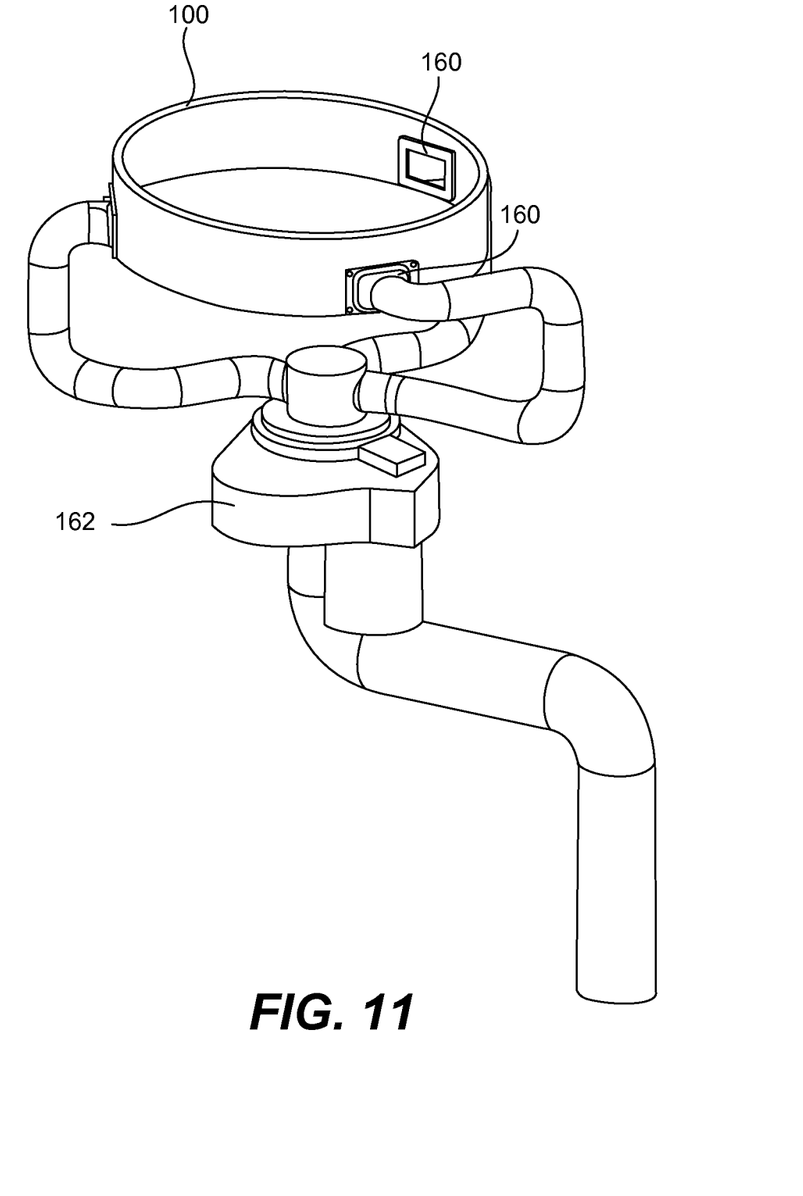
FIG. 11 illustrates a three-port exhaust system in accordance with embodiments of the present invention.

Due to space constraints, the efforts to place a floorless processing chamber 100 above another chamber, such as lower chamber 110, results in the need to exhaust a processing chamber 100 from the sidewalls 106 of processing chamber 100. This is a deviation from the prior art chambers in that most processing chambers are exhausted from a single outlet on the bottom to ensure that there is process uniformity. However, in the floorless processing chamber 100 provided herein, three pump ports 160 are placed approximately 120 degrees apart from one another to enable nearly uniform process exhaust pumping. FIG. 11 illustrates a three-port exhaust system in accordance with embodiments of the present invention. These exhaust ports 160 are connected to a central collector 162 outside of the processing chamber 100 at which point a process pressure control pendulum valve enables pressure control. As seen in FIG. 11, the preferred and currently implemented embodiment of the solution involves a chamber with three exhaust ports 160 located on the sidewall 106 of the processing chamber 100. The exhaust ports 160 are located on the sidewall 106 because the processing chamber 100 is floorless. These exhaust ports 160 are roughly the same size and are located 120 degrees apart from one another. The three exhaust ports 160 provide the ability to uniformly pump into the processing chamber 100 and provide adequate internal pressure uniformity at the wafer 115. The pump ports are connected to a single pump source through an external manifold and pressure control device. In particular, a primary pump connection is downstream of this single pressure control pump. The alternative would be to use multiple external pressure control devices to further enable process uniformity tuning. The advantages that were attained include the development of uniform gas pressures and gas flows above the wafer 115 without a truly uniform pumping configuration.

An exemplary process in accordance with the described invention may start with a wafer 115 being placed into a floorless processing chamber 100. Initially, a wafer 115 may come into a VTM 112 through lower chamber 110. The VTM 112 may move the wafer 115 to other chambers to undergo different processes. The wafer 115 may then pass into the processing chamber 100 via VTM interface 114.

Once the wafer 115 is atop the substrate holder 135, processing of the wafer 115 may begin. For example, the wafer 115 may be heated as the wafer 115 is processed. In particular, power side feeds 155 positioned along the sidewalls 106 of processing chamber 100 may provide heat to a substrate holder 135 which in turn heats the wafer 115. As the wafer 115 is heated, the substrate holder 135 may expand radially, thereby compressing the serpentine portion 124 of the side-mounted substrate holder flexures 120. Additionally, process gasses that are provided to processing chamber 100 while processing wafer 115 may be exhausted out of the floorless processing chamber 100 using exhaust ports 160 that are located at sidewalls 106 of the processing chamber 100. Once the wafer 115 is finished processing, the wafer 115 may be raised from the substrate holder 135 using a side-mounted wafer lift ring 140. Then the wafer 115 may be removed via VTM interface 114 and through VTM 112.

Figure 12:
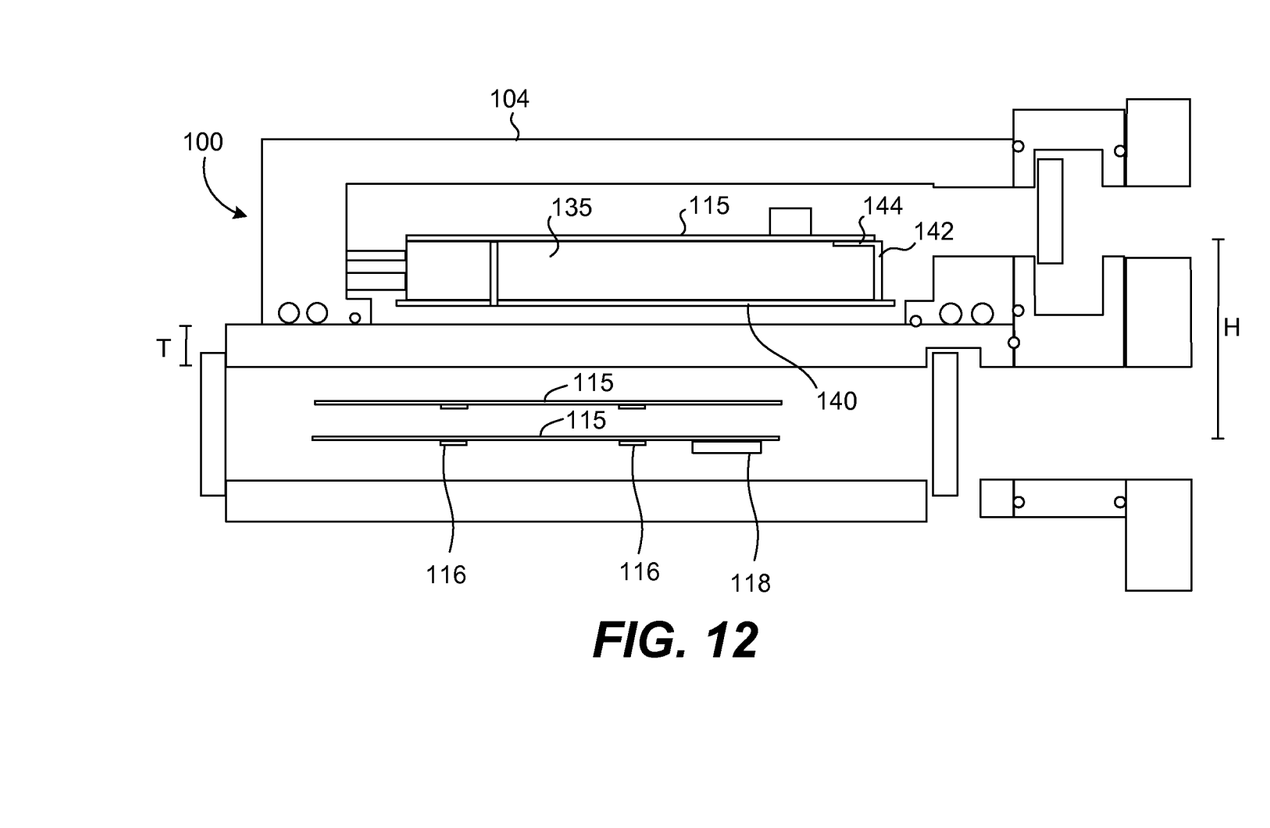
FIG. 12 illustrates a generalized view of a processing chamber and transfer arm in accordance with embodiments of the present invention.

The design of processing chamber 100 allows height to be minimized within the combined processing chamber 100 and lower chamber 110. In particular, as shown in FIG. 12, the height that is minimized is defined by the distance between the two planes defined by, first, the lowest wafer supports 116 that hold wafer 115 in the airlock (lower chamber 110) and, second, the three posts 142 of wafer lift ring 140 in their "up" position in the strip chamber (processing chamber 100). This height is represented as "H" in FIG. 12. In this way, the tops of fingers 144 of posts 142 of wafer lift ring 140 in their "up" position defines a wafer resting position for a highest wafer handoff plane. Further, the lowest wafer support defines a second wafer resting position for a lowest wafer handoff plane. Both planes need to be reachable by a transfer arm 118, which is limited in its vertical stroke. Examples of a transfer arm 118 include a vacuum robot arm, a VTM robot arm, an EFEM robot arm, etc. In embodiments, the vertical stroke of transfer arm 118 is limited to not more than 90 mm.

In an example of transferring a wafer 115 from the lowest wafer support 116 (at elevation 10 mm) to the posts 142 (at elevation 91 mm in their "up" position), a transfer arm 118 may enter lower chamber 110 at an elevation of 7 mm. Elevations are measured as distance from the bottom of lower chamber 110 in combined processing chamber 100 and lower chamber 110. Transfer arm 118 may enter lower chamber 110 at 3 mm below the lowest wafer support 116 elevation of 7 mm so as to ensure proper clearance below wafer 115. From its initial elevation of 7 mm, transfer arm 118 may rise 3 mm to wafer 115 and rise another 3 mm to clear wafer 115 from wafer support 116. Transfer arm 118 may then transfer wafer 115 from lower chamber 110 to processing chamber 100.

In a first embodiment, a transfer arm 118 may enter processing chamber 100 at an elevation of 87 mm. From the elevation of 87 mm, the posts 142 may then be raised to an "up" position of 91 mm, raising wafer 115 with them to 91 mm. In this first embodiment, transfer arm 118 may enter processing chamber 100 at an elevation of 87 mm and lift wafer 115 off posts 142 via transfer arm 118. As such, in the first embodiment, the transfer arm 118 would move across a vertical stroke of 80 mm from an elevation of 7 mm to an elevation of 87 mm.

In a second embodiment, transfer arm 118 may enter processing chamber 100 so as to place wafer atop posts 142 in an "up" position. In this second embodiment, transfer arm 118 may enter processing chamber 100 at an elevation of 95 mm and then lower 4 mm to place wafer 115 on posts 142 in an "up" position at 91 mm. As such, in the second embodiment, the transfer arm 118 would move across a vertical stroke of 88 mm from an elevation of 7 mm to an elevation of 95 mm. In both embodiments, the elevation through which the transfer arm 118 transgresses is dependent upon height "H" as described above.

The height "H" may be reduced by shortening components of combined processing chamber 100 and lower chamber 110. For example, when there is a chamber wall thickness, represented as "T", in FIG. 12, of 16 mm between processing chamber 100 and lower chamber 110, the height "H" between the lowest wafer support 116 (at elevation 10 mm) and the posts 142 in their "up" position (at 91 mm) may be 81 mm. By reducing the chamber wall thickness "T" between the processing chamber 100 and the lower chamber 110, this height "H" within the two chambers 100, 110 may be further reduced. For example, if a barrier between the chambers has a thickness of 14 mm rather than a thickness of 16 mm, the overall height reduction within the two chambers 100, 110 would be reduced from 81 mm to 79 mm. In this way, the height "H" within the two chambers 100, 110 combined may continue to be minimized as further reductions are developed.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A processing chamber, comprising:
   a chamber housing having a top and sidewalls;
   a seal for connecting the sidewalls of the chamber housing to a top of a lower chamber positioned below the processing chamber;
   a substrate holder that is attached to the sidewalls of the chamber housing;
   a wafer lift ring supported by a side arm extending through the sidewalls of the chamber housing, wherein the wafer lift ring has at least three posts that stand vertically, each post having at least one finger that extends horizontally from the post, and wherein the top of the fingers of the wafer lift ring in an up position define a first wafer handoff plane; and
   the lower chamber having at least one wafer support, wherein the top of the lowest at least one wafer support defines a second wafer handoff plane,
   wherein the height between the first wafer handoff plane and the second wafer handoff plane is not greater than a maximum vertical stroke of a transfer arm that is configured to transfer a wafer from the first wafer handoff plane and the second wafer handoff plane.

2. The chamber of claim 1, wherein the maximum vertical stroke of the transfer arm is not greater than 90 mm.

3. The chamber of claim 1, wherein the fingers sit within pockets of the substrate holder when the wafer ring is in a lowered position.

4. A processing chamber, comprising:
   a chamber housing having a top and sidewalls;
   a seal for connecting the sidewalls of the chamber housing to a top of a chamber positioned below the processing chamber; and
   a substrate holder attached to the sidewalls of the chamber housing via flexible side mountings having convolutions.

5. The chamber of claim 4, wherein gimbaling features are integrated into the flexible side mountings.

6. The chamber of claim 5, wherein at least one gimbaling feature has a gimbaling screw.

7. The chamber of claim 6, wherein the at least one gimbaling feature has two jacking screws surrounding the gimbaling screw.

8. A processing chamber, comprising:
   a chamber housing having a top and sidewalls;
   a seal for connecting the sidewalls of the chamber housing to a top of a chamber positioned below the processing chamber; and
   a substrate holder attached to the sidewalls of the chamber housing via flexible side mountings having convolutions; and
   a wafer lift ring that is supported horizontally through the sidewalls of the chamber housing.

9. The chamber of claim 4, further comprising:
   power side feeds provided through the sidewalls of the chamber housing.

10. The chamber of claim 4, further comprising:
    three exhaust ports each located along the sidewalls of the chamber housing.

11. A processing chamber, comprising:
    a chamber housing having a top and sidewalls;

a seal for connecting the sidewalls of the chamber housing to a top of a chamber positioned below the processing chamber;

a substrate holder that is attached to the sidewalls of the chamber housing, wherein the substrate holder is attached to the sidewalls via flexible side mountings having convolutions; and a wafer lift ring supported by a side arm extending through the sidewalls of the chamber housing.

12. The chamber of claim 11, wherein the flexible side mountings are attached to a substrate holder via substrate holder mounts.

13. The chamber of claim 12, wherein the substrate holder mounts provide a heat choke between the substrate holder and the flexible side mountings.

14. The chamber of claim 11, wherein gimbaling features are integrated into the flexible side mountings.

15. The chamber of claim 14, wherein at least one gimbaling feature has a gimbaling screw.

16. The chamber of claim 15, wherein the at least one gimbaling feature has two jacking screws surrounding the gimbaling screw.

* * * * *